US012800663B2

(12) United States Patent
Kim et al.

(10) Patent No.: US 12,800,663 B2
(45) Date of Patent: Nov. 17, 2026

(54) METHOD FOR SCREENING LOW-VOLTAGE DEFECTIVE BATTERY

(71) Applicant: LG ENERGY SOLUTION, LTD., Seoul (KR)

(72) Inventors: Sung Tae Kim, Daejeon (KR); Nak Gi Sung, Daejeon (KR); Joon Sup Kang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 520 days.

(21) Appl. No.: 18/268,911

(22) PCT Filed: Dec. 1, 2022

(86) PCT No.: PCT/KR2022/019344
§ 371 (c)(1),
(2) Date: Jun. 21, 2023

(87) PCT Pub. No.: WO2023/106729
PCT Pub. Date: Jun. 15, 2023

(65) Prior Publication Data

US 2024/0044987 A1 Feb. 8, 2024

(30) Foreign Application Priority Data

Dec. 9, 2021 (KR) ........................ 10-2021-0175819

(51) Int. Cl.
*G01R 31/36* (2020.01)
*G01R 31/392* (2019.01)

(52) U.S. Cl.
CPC ....... *G01R 31/3648* (2013.01); *G01R 31/392* (2019.01)

(58) Field of Classification Search
CPC .............. G01R 31/3648; G01R 31/392; G01R 19/16542; G01R 31/367; G06N 3/0442
See application file for complete search history.

(56) References Cited

U.S. PATENT DOCUMENTS 10,241,155 B2 3/2019 Yamashita
10,794,960 B2 10/2020 Kim et al.
(Continued)

FOREIGN PATENT DOCUMENTS

CN 106021738 A 10/2016
CN 107219468 A 9/2017
(Continued)

OTHER PUBLICATIONS

Extended European Search Report for European Application No. 22902494.8, dated May 23, 2024.
(Continued)

*Primary Examiner* — Ricky Go
(74) *Attorney, Agent, or Firm* — Birch, Stewart, Kolasch & Birch, LLP

(57) ABSTRACT

Disclosed herein relates to a method for screening a low-voltage defective battery including: (a) a pre-filtering step of collecting data and removing secondary batteries having an outlier data in real time during an activation process of multiple secondary batteries; (b) a clustering step of clustering based on similar characteristics or records for multiple pre-filtered secondary batteries; (c) a correction step of measuring the amount of voltage drop (ΔOCV) for each cluster and correcting a dispersion of the amount of voltage drop (ΔOCV) according to a temperature or a period; and (d) a screening step of screening low-voltage defective batteries based on a corrected dispersion of the amount of voltage drop.

12 Claims, 5 Drawing Sheets

(56) References Cited

U.S. PATENT DOCUMENTS

| | | | | |
|---|---|---|---|---|
| 2016/0252586 | A1* | 9/2016 | Shimura | G01R 31/389 702/63 |
| 2017/0115355 | A1 | 4/2017 | Willard et al. | |
| 2019/0033380 | A1 | 1/2019 | Kim et al. | |
| 2021/0135304 | A1 | 5/2021 | Lee et al. | |
| 2021/0156925 | A1 | 5/2021 | Park et al. | |
| 2022/0360091 | A1* | 11/2022 | Nguyen | G01R 31/392 |
| 2023/0055095 | A1* | 2/2023 | Wang | G01R 31/3835 |
| 2023/0122362 | A1* | 4/2023 | Shoa Hassani Lashidani | G01R 31/3648 702/63 |
| 2023/0280411 | A1* | 9/2023 | Masse | G01R 31/396 702/63 |

FOREIGN PATENT DOCUMENTS

| | | | |
|---|---|---|---|
| CN | 109904905 | A | 6/2019 |
| CN | 107290678 | B | 12/2019 |
| CN | 111239631 | A | 6/2020 |
| CN | 112349977 | A | 2/2021 |
| CN | 112368588 | A | 2/2021 |
| CN | 113049976 | A | 6/2021 |
| JP | 2001-116811 | A | 4/2001 |
| JP | 2004-361253 | A | 12/2004 |
| JP | 4720221 | B2 | 7/2011 |
| JP | 6123637 | B2 | 5/2017 |
| JP | 2019-102186 | A | 6/2019 |
| JP | 2020-129466 | A | 8/2020 |
| JP | 2021-57318 | A | 4/2021 |
| KR | 2002-0068228 | A | 8/2002 |
| KR | 10-1581425 | B1 | 12/2015 |
| KR | 10-2064459 | B1 | 1/2020 |
| KR | 10-2020-0023672 | A | 3/2020 |
| KR | 10-2020-0084510 | A | 7/2020 |
| KR | 10-2020-0117594 | A | 10/2020 |
| KR | 10-2021-0066096 | A | 6/2021 |
| KR | 10-2021-0132843 | A | 11/2021 |
| WO | WO 2020/147315 | A1 | 7/2020 |

OTHER PUBLICATIONS

International Search Report (PCT/ISA/210) issued in PCT/KR2022/019344 mailed on Mar. 7, 2023.

Li et al., "An Ensemble Hybrid Model with Outlier Detection for Prediction of Lithium-ion Battery Remaining Useful Life", 2019 Chinese Control And Decision Conference (CCDC), pp. 2630-2635.

Korean Office Action for Korean Application No. 10-2021-0175819, dated Feb. 11, 2025, with English translation.

Chinese Office Action and Search Report for Chinese Application No. 202280008723.9, dated Mar. 26, 2026, with English translation of the Office Action.

Chinese Notice of Allowance and Search Report for Chinese Application No. 202280008723.9, dated Aug. 26, 2026, with English translation of the Notice of Allowance.

* cited by examiner

[FIG. 1]
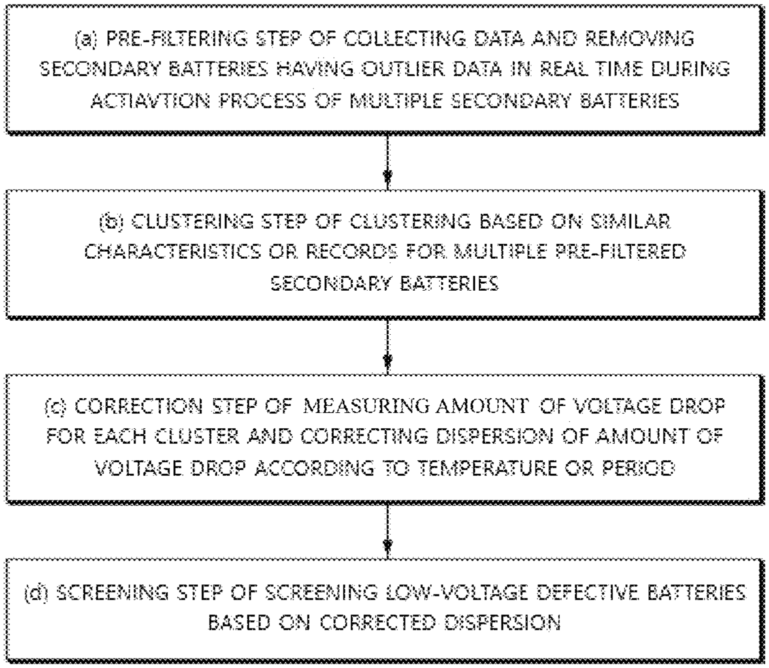

[FIG. 2]
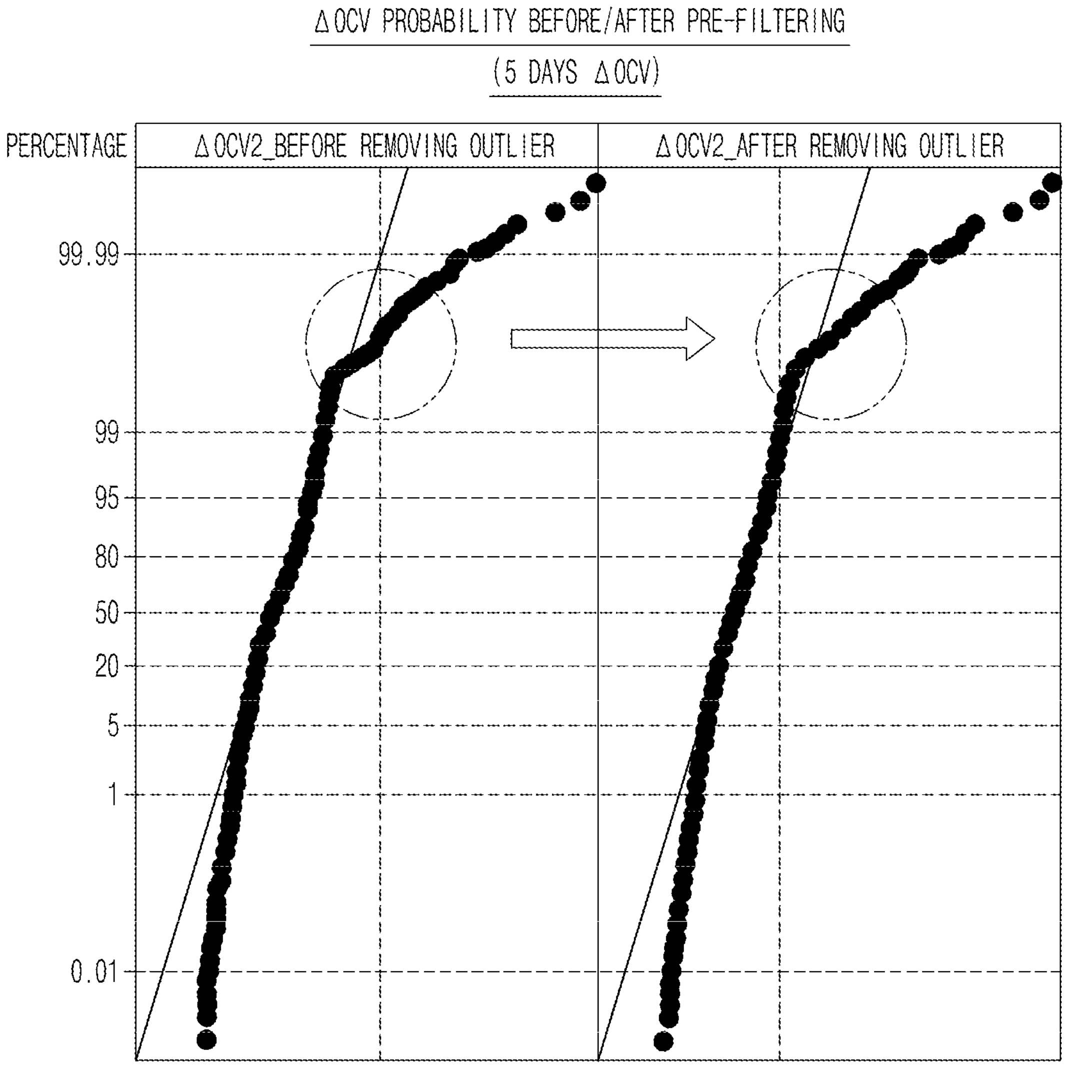

[FIG. 3]
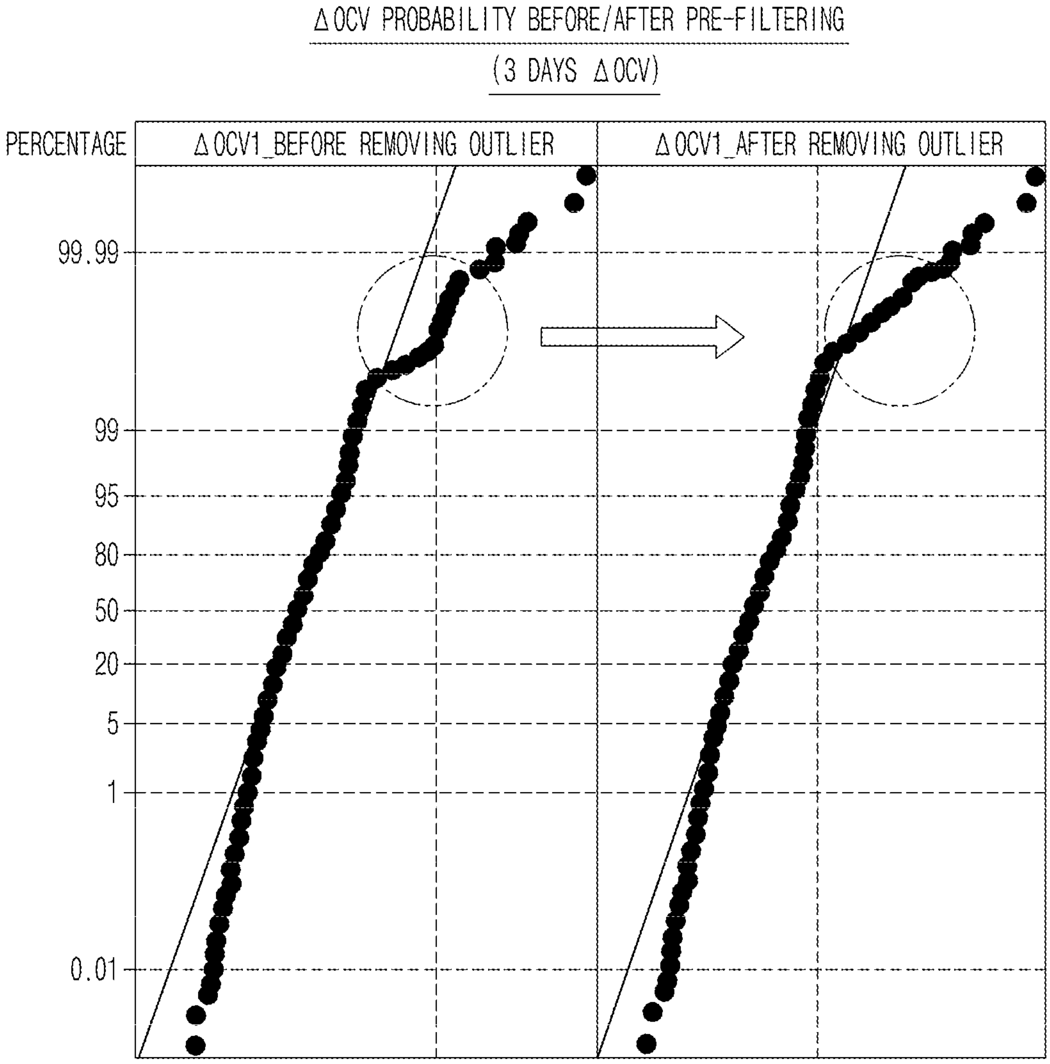

[FIG. 4]
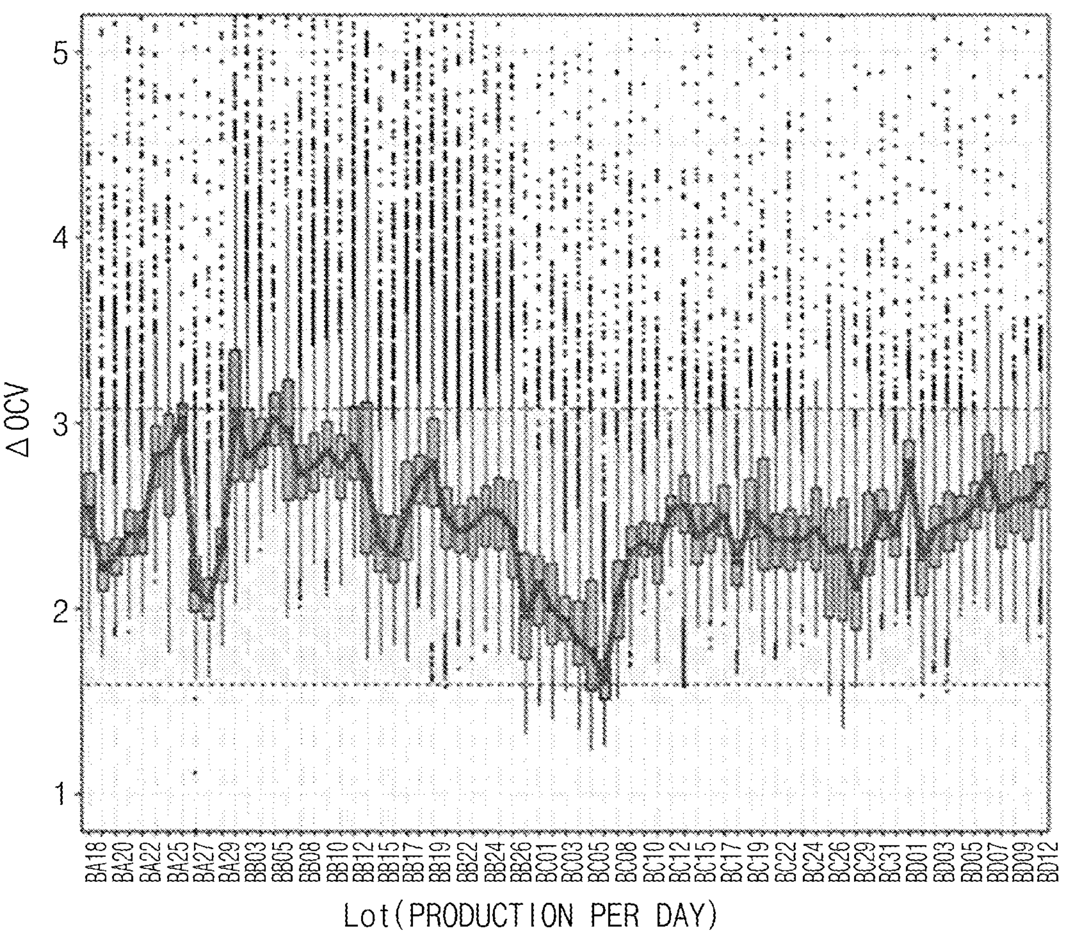

[FIG. 5]
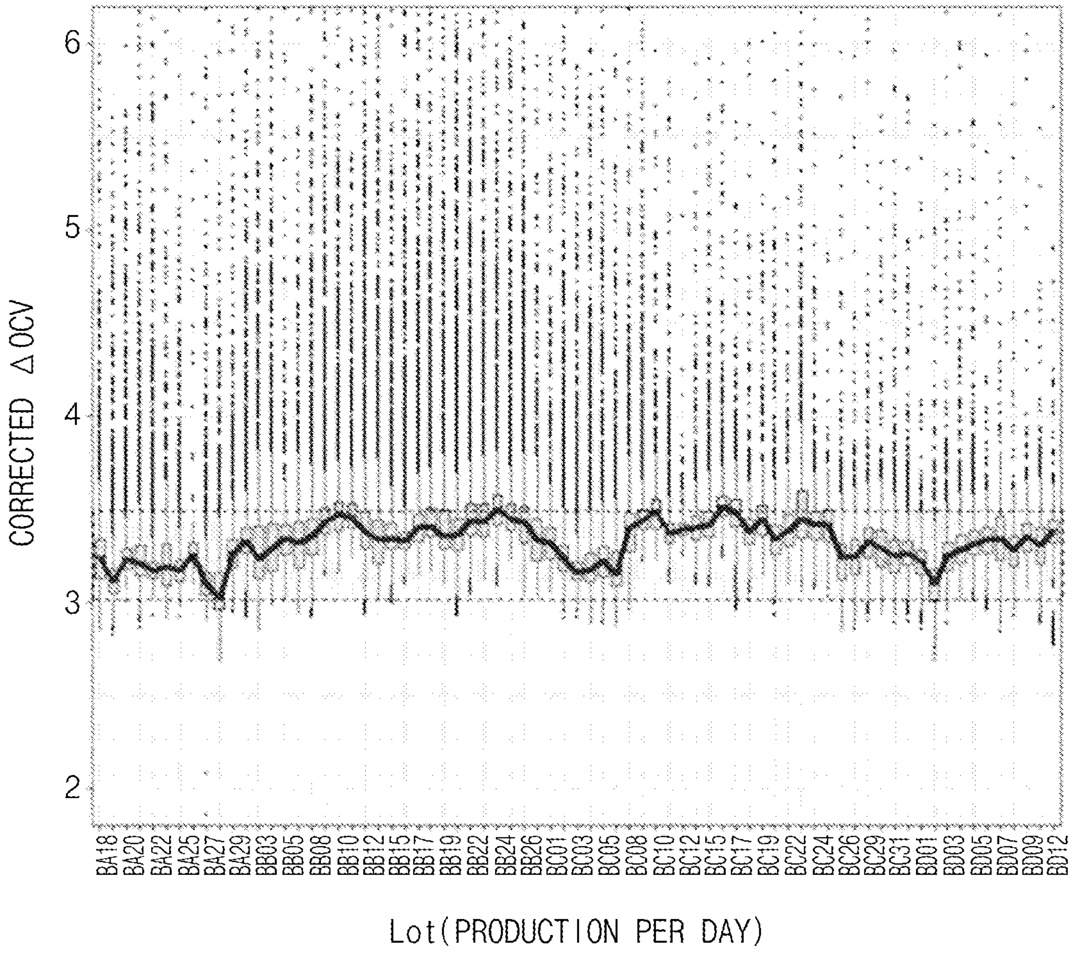

METHOD FOR SCREENING LOW-VOLTAGE DEFECTIVE BATTERY

TECHNICAL FIELD

This application is the National Phase of International Application No. PCT/KR2022/019344 filed on Dec. 1, 2022, which claims priority under 35 U.S.C. § 119 (a) to Korean Patent Application No. 10-2021-0175819 filed in the Republic of Korea on Dec. 9, 2021, all of which are hereby expressly incorporated by reference into the present application.

The present invention relates to a method for screening a low-voltage defective battery with improved detection reliability.

BACKGROUND TECHNOLOGY OF THE INVENTION

In general, unlike a primary battery that cannot be charged, a secondary battery means a battery that can be charged and discharged, and is widely used in electronic devices such as mobile phones, laptops, camcorders, etc., or electric vehicles, etc. In particular, since a lithium secondary battery has a higher capacity than a nickel-cadmium battery or a nickel-cistern battery and has a high energy density per unit weight, the degree of utilization thereof is rapidly increasing.

These lithium secondary batteries mainly use lithium-based oxides and carbon materials as a positive electrode active material and a negative electrode active material, respectively. Lithium secondary batteries are provided with an electrode assembly in which a positive electrode plate and a negative electrode plate coated with such a positive electrode active material and a negative electrode active material, respectively, are disposed with a separator interposed therebetween, and an exterior material for sealing and accommodating the electrode assembly together with an electrolyte.

Various types of defects may occur in the lithium secondary battery due to various causes during the manufacturing process or during use. Particularly, some of the secondary batteries that have been already manufactured exhibit a phenomenon showing a voltage drop greater than their self-discharge rate, and this phenomenon is referred to as a low-voltage.

Such a low-voltage defect phenomenon of a secondary battery is typically caused by a metal foreign material located on the inside. In particular, when a metal foreign material such as iron or copper is present in a positive electrode plate of the secondary battery, the metal foreign material may grow into a dendrite in the negative electrode. In addition, such dendrites cause an internal short circuit of the secondary battery, which may cause a failure or a damage of the secondary battery, and in severe cases, may be a cause of ignition.

Meanwhile, the above low-voltage defect appears as a relative increase in voltage drop, and the low-voltage defect is detected through an aging process during an activation process of the secondary battery. Specifically, during the (shipment) aging period, the low-voltage defective battery may be screened by comparing the drop of the measured open circuit voltage with a reference value while monitoring the open circuit voltage (OCV) of the battery.

Conventionally, when deriving such a reference value, a threshold is selected from the dispersion of the amount of the voltage drop (ΔOCV) of data accumulated during the battery production process, and a tray-scale standard scaling is performed to the remaining data after screening through the above threshold, so that a specific sigma (e.g., 36 or 40 was taken as a reference value. And batteries exceeding the specific sigma were detected as low-voltage defective batteries.

However, in such a conventional method, since a specific threshold does not reflect a manufacturing deviation, there is a risk of not being able to screen a defective product or over-detecting a non-defective product as defective when manufacturing deviation occurs, and when manufacturing deviations accumulate for each unit process, the dispersion of open circuit voltage or voltage drop (ΔOCV) increases or an abnormal dispersion occurs at the time of low-voltage defect inspection, which can blur the boundary between a good product and a defective product.

Accordingly, in screening low-voltage defective batteries, it is necessary to develop a technology for a method for screening low-voltage defective batteries that can reliably distinguish between a good product and a defective product even when there is a manufacturing deviation.

DESCRIPTION OF THE INVENTION

Technical Problem

The present invention is directed to provide a method for screening a low-voltage defective battery with an increased detectability of good and defective batteries by improving the dispersion of the amount of voltage drop (ΔOCV) at the time of screening the low-voltage defective batteries.

Technical Solution

A method for screening a low-voltage defective battery includes: (a) a pre-filtering step of collecting data and removing secondary batteries having an outlier data in real time during an activation process of multiple secondary batteries;

(b) a clustering step of clustering secondary batteries among the multiple secondary batteries based on similar characteristics or records for multiple pre-filtered secondary batteries;

(c) a correction step of measuring the amount of voltage drop for each cluster, and correcting a dispersion of the amount of voltage drop according to a temperature or a period; and (d) a screening step of screening low-voltage defective batteries based on a corrected dispersion of the amount of voltage drop, among the multiple secondary batteries.

In an exemplary embodiment of the present invention, the pre-filtering step (a) removes outliers using a time-series anomaly detection algorithm. Here, the time-series anomaly detection algorithm is one selected from the group consisting of Control chart, Random Cut Forest, Dynamic Time Warping, TAnoGAN (Time Series Anomaly Detection with Generative Adversarial Networks), MAD-GAN (Multivariate Anomaly Detection for Time Series Data with Generative Adversarial Networks), USAD (UnSupervised Anomaly Detection on Multivariate Time Series), LSTM (Long Short-Term Memory)+autoencoder (AE), and LSTM+CNN (Convolutional Neural Network).

In an exemplary embodiment of the present invention, the clustering step (b) clusters secondary batteries having an identical criterion selected from the group consisting of a production lot unit, a tray unit, an aging temperature, a charge/discharge temperature, and an aging period, among the multiple secondary batteries.

In an exemplary embodiment of the present invention, the correction step (c) includes a step of correcting the dispersion of the voltage drop by a linear regression or a machine learning method.

In an exemplary embodiment of the present invention, the pre-filtering step (a), for each individual unit process, includes a process of collecting an open circuit voltage (OCV) or a voltage drop of each of the multiple secondary batteries as the data.

In an exemplary embodiment of the present invention, the individual unit process (a) includes at least one of an initial charging process, a room temperature aging process, and a high temperature aging process.

In an exemplary embodiment of the present invention, the screening step (d) screens low-voltage defective batteries in the corrected dispersion using an anomaly detection algorithm. Here, the anomaly detection algorithm is one selected from the group consisting of Local Outlier Factor (LOF), Isolation forest, and One-Class (OC) Support Vector Machine (SVM).

In an exemplary embodiment of the present invention, the screening step (d) is performed after completing aging for shipment.

In an exemplary embodiment of the present invention, the screening step (d) screens the low-voltage defective batteries for each cluster.

In an exemplary embodiment of the present invention, the screening step (d) screens the low-voltage defective batteries after collecting the dispersion data of the voltage drop for each cluster corrected by the step (c).

Advantageous Effects

The method for detecting and sorting low voltage according to the present invention has an excellent detectability and can reduce the time required to screen low-voltage defective batteries.

BRIEF DESCRIPTION OF THE DRAWINGS

FIG. 1 is a flowchart of a method for screening defective low-voltage batteries according to an exemplary embodiment of the present invention.

FIG. 2 and FIG. 3 are cumulative probability distribution diagrams of an amount of voltage drop before and after a pre-filtering step of the present invention.

FIG. 4 is a graph showing a dispersion of an amount of voltage drop that has not gone through a correction step according to the present invention.

FIG. 5 is a graph showing a dispersion of an amount of voltage drop after a correction step according to the present invention.

BEST MODE FOR CARRYING OUT THE INVENTION

The present invention may have various modifications and various examples, and thus specific examples are illustrated in the drawings and described in detail in the description. However, it should be understood that the present invention is not limited to specific embodiments, and includes all modifications, equivalents or alternatives within the spirit and technical scope of the present invention.

The terms used in the present invention are only used to describe specific embodiments, and are not intended to limit the present invention. Singular expressions include plural expressions unless the context clearly dictates otherwise. The terms "comprise" or "have", etc. are used herein to designate the presence of characteristics, numbers, steps, actions, components or members described in the specification or a combination thereof, and it should be understood that the possibility of the presence or addition of one or more other characteristics, numbers, steps, actions, components, members or a combination thereof is not excluded in advance.

In the present specification, the dispersion of the amount of voltage drop means a graph in which the voltage drop values of each of the large amount of secondary batteries are listed or plotted.

FIG. 1 is a flowchart of a method for screening low-voltage defective batteries according to an exemplary embodiment of the present invention. A method for screening low-voltage defective batteries according to the present invention with reference to FIG. 1 includes: (a) a pre-filtering step of collecting data and removing secondary batteries having an outlier data in real time during an activation process of multiple secondary batteries; (b) a clustering step of clustering based on similar characteristics or records for multiple pre-filtered secondary batteries; (c) a correction step of measuring the amount of voltage drop (ΔOCV) for each cluster, and correcting a dispersion of the amount of voltage drop (ΔOCV) according to a temperature or a period; (d) a screening step of screening low-voltage defective batteries based on a corrected dispersion of the amount of voltage drop.

Since the method for screening low-voltage defective batteries according to the present invention removes potential defective batteries exhibiting outlier data in individual unit processes constituting an activation process, clusters batteries removed with such potential defective batteries and having a common factor, measures the amount of voltage drop for each cluster, and corrects the dispersion of the measured amount of voltage drop, it can enhance the detectability of the low-voltage defective batteries and reduce the risk of over-detection or non-detection due to manufacturing deviation at the time of screening low-voltage defective batteries by having an improved dispersion of the total amount of voltage drop.

The pre-filtering step (a) is a process of removing potentially defective batteries in advance, collecting data during the secondary battery activation process, and removing secondary batteries exhibiting outliers from the collected data in real time. Through this, it is possible to improve the dispersion of the amount of voltage drop at the time of screening defective batteries.

The secondary battery activation process is a step of activating the battery so that the assembled lithium secondary battery can be used. The assembly process of the secondary battery is a process of accommodating an electrode assembly including a positive electrode/a separator/a negative electrode inside a battery case and sealing it after injecting an electrolyte. The completion of this assembly process does not mean that the battery can be used immediately. In order to make the battery usable, it is necessary to conduct processes such as causing an electrochemical reaction between the electrode and the electrolyte through charging, discharging the gas generated at this time to the outside of the battery, stabilizing the battery, etc., and such a series of processes are called an activation process.

The activation process of such a secondary battery includes individual unit processes such as a pre-aging process of aging the battery so that an electrolyte is impregnated into an electrode assembly immediately after assembly of the secondary battery, an initial charging process of charging the battery until it reaches a set SOC, an aging process for aging an initially charged battery, a degassing process for discharging gas generated during the initial charging and the aging process to the outside of the battery, etc. The aging process may include a high temperature aging process or a room temperature aging process, or may include both of them.

In the pre-filtering step (a) of the present invention, in order to remove potentially defective batteries in advance while performing such individual unit processes, it includes processes of collecting an open circuit voltage (OCV) of the secondary battery or an amount of voltage drop of the battery as data and removing the secondary battery indicating an outlier data in real time.

In one specific example, the individual unit process for collecting data and removing outlier data may include at least one of an initial charging process and an aging process. To explain this using a specific example, when an initial charging process or an aging process is performed on a plurality of secondary batteries, the open circuit voltage of the secondary batteries is measured and collected as data, secondary batteries exhibiting an outlier in the collected data are removed in real time, and subsequent processes are performed on the secondary batteries remaining after the removal.

In the pre-filtering step (a), a method for removing outliers utilizes a time-series anomaly detection algorithm. Time-series anomaly detection is a technique for finding rare patterns or target objects that deviate from or show signs of deviating from the general patterns of other data in the past or at a similar point in time series data. Such anomaly detection algorithms may use known algorithms, and in the embodiment of the present invention, may be one selected from the group consisting of Control chart, Random Cut Forest, Dynamic Time Warping, TAnoGAN (Time Series Anomaly Detection with Generative Adversarial Networks), MAD-GAN (Multivariate Anomaly Detection for Time Series Data with Generative Adversarial Networks), USAD (UnSupervised Anomaly Detection on Multivariate Time Series), LSTM (Long Short-Term Memory)+autoencoder (AE), and LSTM+CNN (Convolutional Neural Network).

FIG. 2 and FIG. 3 show cumulative probability distribution diagrams of an amount of voltage drop (ΔOCV) according to time before and after removing secondary batteries exhibiting outlier data through a pre-filtering step according to an exemplary embodiment of the present invention.

Referring to FIG. 2 and FIG. 3, in the case of going through a pre-filtering step, it can be confirmed that the dispersion of the amount of the voltage drop is improved as it clearly shows at the point where the slope of the cumulative probability distribution changes.

In addition, in the case of going through the pre-filtering step, dispersions are improved in both the voltage drop at the time of 5 days have passed (ΔOCV on 5 days) and the voltage drop at the time of 3 days have passed (ΔOCV on 3 days), so that low-voltage screening is possible even after 3 days have elapsed. However, in the case where pre-filtering is not performed, as shown in FIG. 3, when 3 days have elapsed, the point at which the slope of the cumulative probability distribution changes are shown at two points, so the boundary between good and bad products is ambiguous. Accordingly, the method for detecting and screening low voltage according to the present invention not only has an excellent detectability, but also reduces the time required to screen low-voltage defective batteries.

The clustering step (b) is a step of clustering secondary batteries having similar characteristics or similar records in a secondary battery manufacturing process. Clustering multiple secondary batteries based on similar characteristics or records does not have manufacturing deviation within the same cluster, so it can improve the problem of increase in the degree of dispersion due to manufacturing deviation and blurring the boundary between good and bad products.

In one specific example, the clustering step (b) may cluster secondary batteries having an identical criterion selected from the group consisting of a production lot unit, a tray unit, an aging temperature, a charge/discharge temperature, and an aging period. Since these factors are manufacturing deviations that affect the dispersion of the amount of voltage drop, it is preferable to cluster secondary batteries based on these factors.

The correction step (c) measures the amount of voltage drop for each cluster and corrects the dispersion of the amount of voltage drop according to a temperature or a period. For each cluster, the correction step (c) includes a process of deriving a dispersion of voltage drop by monitoring an open circuit voltage (OCV) while aging a plurality of batteries under a constant temperature condition, and a process of correcting the dispersion of the amount of voltage drop.

Specifically, the process of deriving the dispersion of the amount of the voltage drop may be a process of measuring the open circuit voltage (OCV1) of the battery at the beginning of aging, and after a certain period T has elapsed, measuring the open circuit voltage (OCV2) of the battery to calculate the amount of voltage drop (ΔOCV=OCV1−OCV2) of the certain period of time, thereby plotting the amount of voltage drop of each of the plurality of batteries.

However, it is known that the amount of voltage drop of a battery is affected by the aging temperature and measurement period (time interval for measuring OCV1 and OCV2) for measuring the amount of voltage drop. That is, even in the case of the same battery, when the time interval T of measuring the voltage drop becomes longer, or when the amount of voltage drop is measured under the condition of a high aging temperature, the amount of voltage drop appears smaller than the actual value.

Accordingly, in order to exclude the effect of the voltage drop measurement conditions (temperature, period) on the amount of voltage drop, the present invention includes a process of correcting the difference in the amount of voltage drop according to the difference in the aging temperature and the measurement period (time interval for measuring OCV1 and OCV2).

The aging process may be one or more selected from aging processes included in the entire battery manufacturing process. Specifically, it may be one or more selected from an aging process before a degassing process, an aging process after full charge and full discharge, and an aging process after charging for shipment.

In one embodiment of the present invention, as a specific method for correcting the dispersion of the amount of voltage drop, a linear regression or a machine learning method may be used. Linear regression is an analytical method that calculates and measures a model between observed variables from a large amount of back data, and is one of the representative statistical analysis methods used when deriving appropriate predicted values according to changes in variables. Machine learning is one of the specific methods of artificial intelligence in which computers learn from large amounts of back data and find patterns and correlations in a large-scale data through experience. Technical configurations of linear regression and machine learning are generally known in the art, so detailed descriptions are omitted.

FIG. 4 is a graph showing the dispersion of the amount of voltage drop that has not undergone the correction step according to the present invention, and FIG. 5 is a graph showing the dispersion of the amount of voltage drop that has undergone the correction step according to the present invention. Referring to these diagrams, it can be seen that the deviation of the voltage drop (ΔOCV) is greatly reduced after going through the correction step according to the present invention.

Even for batteries of the same model, the amount of voltage drop is affected by temperature or period. Linear regression or machine learning is used to investigate the correlation between temperature or period and voltage drop, and by correcting accordingly, the degree of dispersion in the amount of voltage drop can be reduced. In addition, as a result of the voltage drop dispersion being reduced in this way, the outliers in the amount of voltage drop are better revealed, which can facilitate the detection of a low-voltage battery.

The screening step (d) is a step of screening low-voltage defective batteries based on the corrected dispersion of the amount of voltage drop.

In one specific example, the screening step (d) is a statistical method such as cumulative probability distribution, and it derives a threshold within the dispersion of the amount of voltage drop, which is a data listing the amount of voltage drop of each of the large number of secondary batteries obtained through the steps (a) to (c), and screens a secondary battery having a voltage drop exceeding the threshold as a low-voltage defective battery.

In another specific example, the screening step (d) may be screening low-voltage defective batteries from the corrected dispersion by using an anomaly detection algorithm, and the anomaly detection algorithm may be one selected from the group consisting of Local Outlier Factor (LOF), Isolation forest, and One-Class (OC) Support Vector Machine (SVM).

In one embodiment of the present invention, the screening step (d) is to screen low-voltage defective batteries for each cluster. In this case, defective batteries can be screened from the voltage drop dispersion data corrected in the step (c) using the anomaly detection algorithm.

In another exemplary embodiment of the present invention, the screening step (d) screens low-voltage defective batteries after collecting the dispersion data of the amount of voltage drop for each cluster corrected by the step (c). In this case, the dispersion data of each voltage drop for each cluster corrected in step (c) is collected into one, and defective batteries are screened from the collected dispersion data using the anomaly detection algorithm. In this embodiment, since defective batteries are screened at once from the collected dispersion data through the anomaly detection algorithm, there is an effect of screening defective batteries more quickly than screening defective batteries by cluster.

The screening step (d) of the present invention can be performed after completing aging for shipment, which is a latter process of the activation process, and through the steps (a) to (c), and since the degree of dispersion in the amount of voltage drop of the battery is improved, and defective batteries are screened through the anomaly detection algorithm based on an improved degree of dispersion, the reliability of detection is improved.

As above, the present disclosure and diagrams disclose preferred embodiments of the present invention, and although specific terms are used, they are only used in a general sense to easily explain the technical content of the present invention and help understanding of the present invention, and are not intended to limit the scope of the present invention. In addition to the embodiments disclosed herein, it is obvious to those skilled in the art that other modified examples based on the technical idea of the present invention can be implemented.

The invention claimed is:

1. A method, comprising:

collecting data and removing secondary batteries having outlier data in real time during an activation process of multiple secondary batteries;

clustering secondary batteries among the multiple secondary batteries based on similar characteristics or records for multiple pre-filtered secondary batteries;

measuring an amount of voltage drop for each cluster and correcting a dispersion of the amount of voltage drop according to a temperature or a period; and screening low-voltage defective batteries based on a corrected dispersion of the amount of voltage drop, among the multiple secondary batteries, the screening of the low-voltage defective batteries including removal of the low-voltage defective batteries from the multiple secondary batteries, wherein the correction of the dispersion comprises correcting the dispersion of the amount of voltage drop by a machine learning method performed by a processor.

2. The method of claim 1, wherein the collecting data and removing the secondary batteries includes removing outliers using a time-series anomaly detection algorithm.

3. The method of claim 2, wherein the time-series anomaly detection algorithm is one selected from a group consisting of Control chart, Random Cut Forest, Dynamic Time Warping, TAnoGAN (Time Series Anomaly Detection with Generative Adversarial Networks), MAD-GAN (Multivariate Anomaly Detection for Time Series Data with Generative Adversarial Networks), USAD (UnSupervised Anomaly Detection on Multivariate Time Series), LSTM (Long Short-Term Memory)+autoencoder (AE), and LSTM+CNN (Convolutional Neural Network).

4. The method of claim 1, wherein the clustering secondary batteries includes clustering secondary batteries having an identical criterion selected from a group consisting of a production lot unit, a tray unit, an aging temperature, a charge/discharge temperature, and an aging period, among the multiple secondary batteries.

5. The method of claim 1, wherein the correction of the dispersion further comprises correcting the dispersion of the amount of voltage drop by a linear regression.

6. The method of claim 1, wherein the collecting data, for each individual unit process, comprises a process of collecting an open circuit voltage (OCV) or an amount of voltage drop of each of the multiple secondary batteries the data.

7. The method of claim 6, wherein the individual unit process comprises at least one of an initial charging process, a room temperature aging process, and a high temperature aging process.

8. The method of claim 1, wherein the screening of the low-voltage defective batteries in the corrected dispersion uses an anomaly detection algorithm to determine which batteries of the multiple secondary batteries are low-voltage defective batteries that are to be removed.

9. The method of claim 8, wherein the anomaly detection algorithm is one selected from the group consisting of Local Outlier Factor (LOF), Isolation forest, and One-Class (OC) Support Vector Machine (SVM).

10. The method of claim 1, wherein the screening of the low-voltage defective batteries is performed after completing an aging for shipment.

11. The method of claim 1, wherein the screening of the low-voltage defective batteries screens the low-voltage defective batteries for each cluster.

12. The method of claim 1, wherein the screening of the low-voltage defective batteries screens the low-voltage defective batteries after collecting dispersion data of the amount of voltage drop for each cluster corrected by the correcting the dispersion.

* * * * *